US010373802B2

(12) United States Patent
Yamazawa et al.

(10) Patent No.: US 10,373,802 B2
(45) Date of Patent: Aug. 6, 2019

(54) TRANSMISSION SCANNING MICROSCOPY INCLUDING ELECTRON ENERGY LOSS SPECTROSCOPY AND OBSERVATION METHOD THEREOF

(71) Applicant: HITACHI HIGH-TECHNOLOGIES CORPORATION, Minato-ku, Tokyo (JP)

(72) Inventors: Yu Yamazawa, Tokyo (JP); Kazutoshi Kaji, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/764,158

(22) PCT Filed: Sep. 29, 2015

(86) PCT No.: PCT/JP2015/077411

§ 371 (c)(1),
(2) Date: Mar. 28, 2018

(87) PCT Pub. No.: WO2017/056170

PCT Pub. Date: Apr. 6, 2017

(65) Prior Publication Data

US 2018/0308659 A1 Oct. 25, 2018

(51) Int. Cl.
*H01J 37/28* (2006.01)
*H01J 37/20* (2006.01)
(Continued)

(52) U.S. Cl.
CPC .............. *H01J 37/28* (2013.01); *H01J 37/20* (2013.01); *H01J 37/22* (2013.01); *H01J 37/244* (2013.01);
(Continued)

(58) Field of Classification Search
CPC .......... H01J 37/00; H01J 37/02; H01J 37/147; H01J 37/1472; H01J 37/1474;
(Continued)

(56) References Cited

U.S. PATENT DOCUMENTS

2005/0285037 A1 12/2005 Nakamura et al.
2013/0126729 A1* 5/2013 Own .................... C12Q 1/6869 250/307
2014/0175279 A1* 6/2014 Agemura .............. H01J 37/244 250/310

FOREIGN PATENT DOCUMENTS

JP 2004-319233 A 11/2004
JP 2006-012583 A 1/2006
(Continued)

OTHER PUBLICATIONS

R.F. Egerton; "Electron Energy Loss Spectroscopy in the Electron Microscope", Third Edition, Plenum Press, 1986, pp. 102-105.
(Continued)

*Primary Examiner* — Jason L McCormack
(74) *Attorney, Agent, or Firm* — Miles & Stockbridge PC

(57) ABSTRACT

An object of the present invention relates to high-resolution observation on a light field STEM, a dark field image STEM, and an EELS, at a low acceleration voltage.
The present invention relates to controlling on incorporation angles of a STEM detector and an electron energy loss spectroscopy by changing the disposition of a sample with respect to an optical axis direction of a primary electron beam in a scanning transmission microscopy including an electron energy loss spectroscopy.
According to the present invention, it is possible to easily control an optimum scattering angle in each of a light field STEM, a dark field STEM, and an EELS while suppressing
(Continued)

occurrence of chromatic aberration accompanying the controlling on the incorporation angle.

10 Claims, 3 Drawing Sheets

(51) Int. Cl.
*H01J 37/244* (2006.01)
*H01J 37/22* (2006.01)
*H01J 37/26* (2006.01)

(52) U.S. Cl.
CPC ... *H01J 37/265* (2013.01); *H01J 2237/20207* (2013.01); *H01J 2237/20235* (2013.01); *H01J 2237/24485* (2013.01); *H01J 2237/2802* (2013.01)

(58) Field of Classification Search
CPC .... H01J 37/1475; H01J 37/1478; H01J 37/20; H01J 37/22; H01J 37/244; H01J 37/26; H01J 37/261; H01J 37/265
USPC .......................................... 250/306, 307, 311
See application file for complete search history.

(56) References Cited

FOREIGN PATENT DOCUMENTS

| | | | |
|---|---|---|---|
| JP | 2006-190567 | A | 7/2006 |
| JP | 2009-152124 | A | 7/2009 |
| JP | 2012-43563 | A | 3/2012 |
| WO | WO 2014/155557 | A1 | 10/2014 |

OTHER PUBLICATIONS

Daisuke Shindo et al.; "Analytical Electron Microscopy for Material Evaluation", Kyoritsu Publishing Co., Ltd., 1999, pp. 52-62.
International Search Report of International Application No. PCT/JP2015/077411, dated Dec. 15, 2015.

* cited by examiner

[Fig. 1]
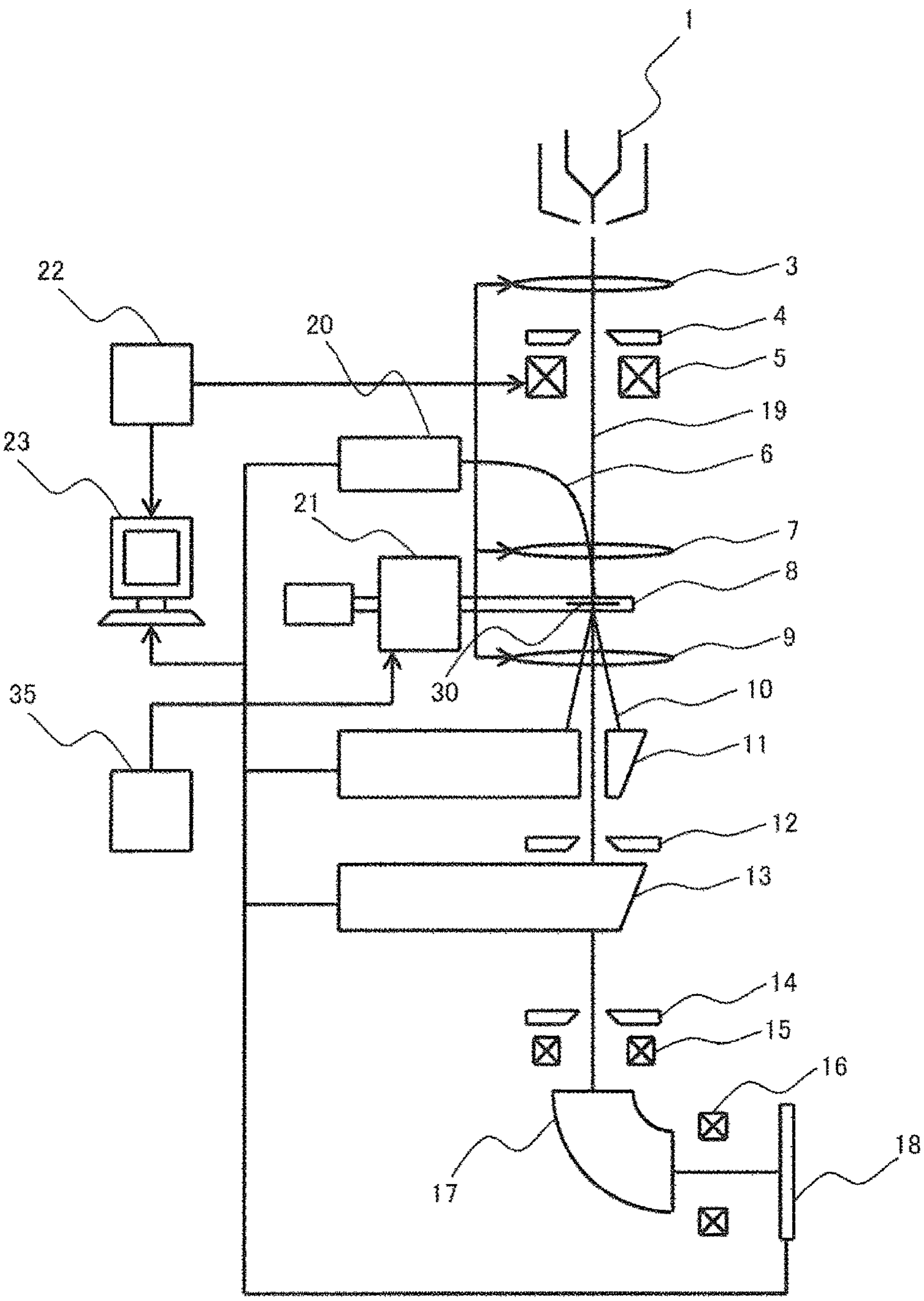

[Fig. 2]
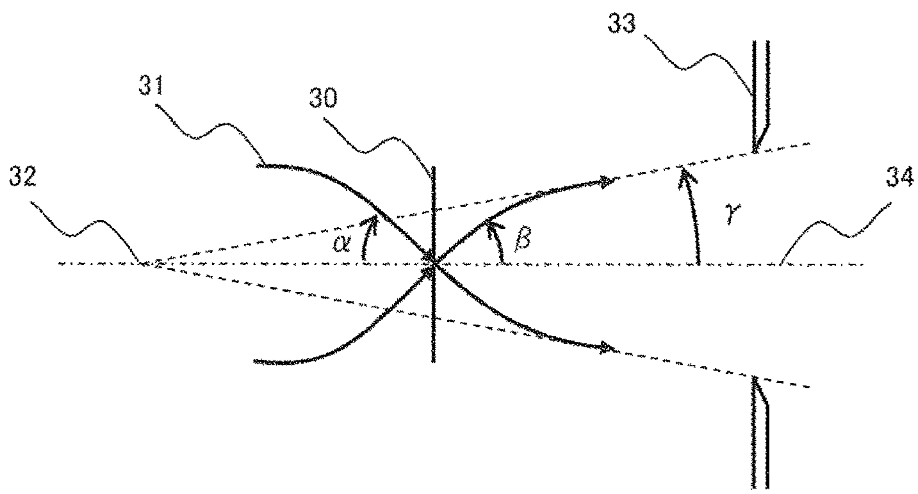
[Fig. 3]
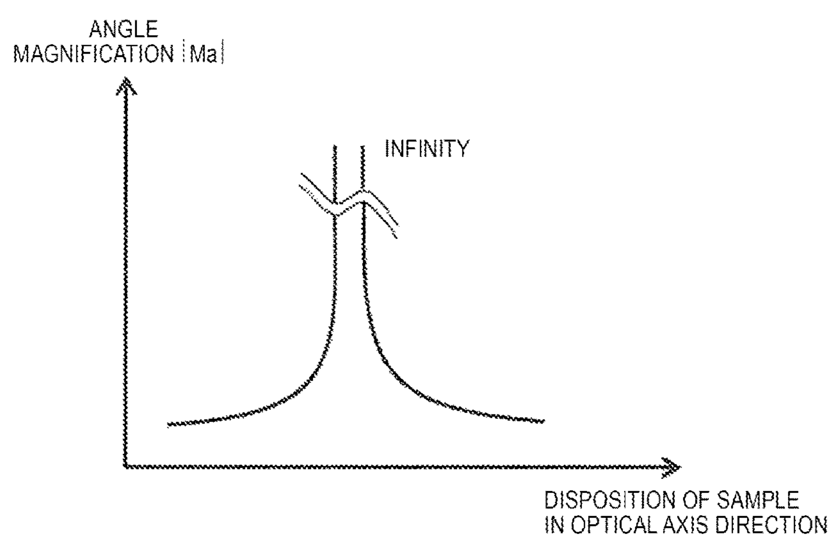

[Fig. 4]
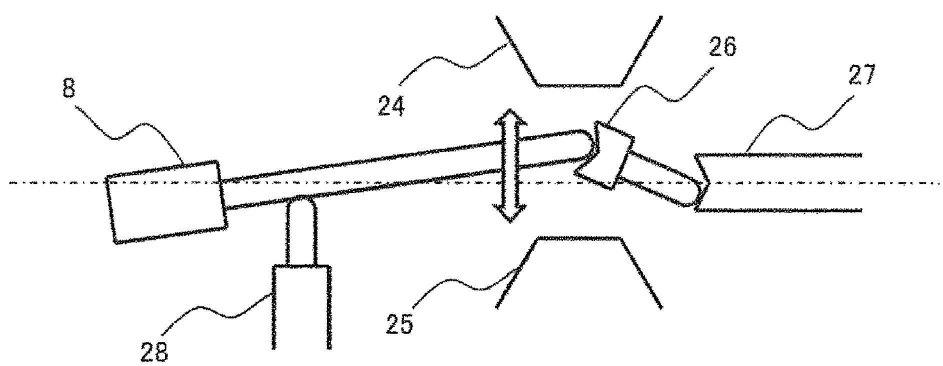
[Fig. 5]
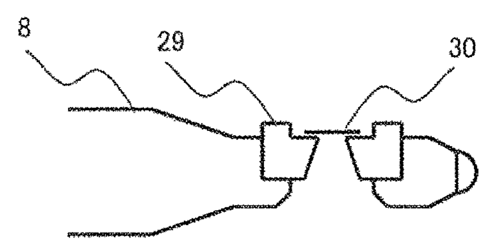
[Fig. 6]
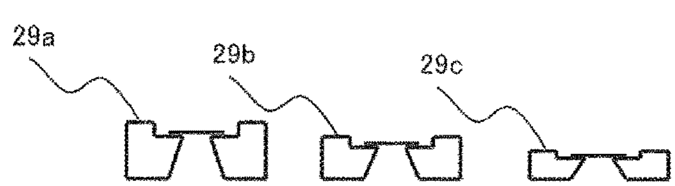

TRANSMISSION SCANNING MICROSCOPY INCLUDING ELECTRON ENERGY LOSS SPECTROSCOPY AND OBSERVATION METHOD THEREOF

TECHNICAL FIELD

The present invention relates to a scanning transmission microscopy including an electron energy loss spectroscopy.

BACKGROUND ART

In NPL 1, a method for combining an electron energy loss spectroscopy (EELS) with a scanning transmission microscopy (STEM) is described.

The STEM is a device that observes a structure of a sample with a high spatial resolution by using an electron beam. In addition, the EELS can acquire an energy loss spectrum by interacting with the sample with high energy resolution by using an energy spectroscopy attached as an attachment device of the STEM. Furthermore, by selectively detecting the electron of specific energy, it is possible to acquire an energy filter image.

When a thin film sample is irradiated with the electron beam, the electron beam interacts the sample according to a type and a structure of elements configuring the sample. By selectively detecting an angle and energy of the transmitted electron beam, it is possible to acquire various types of information.

For example, an image formed by the electrons scattered at a low angle of several tens mrad or less or the electrons transmitted without scattering is called as a bright field image. On the other hand, information depending on the density of the sample is included in the electron beam scattered at a high angle, which is suitable for identifying constituent elements and is called as a dark field image. In a case where the dark field image is acquired by an annular detector, an optimum value presents in a scattering angle range to be detected. Although it depends on an acceleration voltage, for example, it is preferable to appropriately set an optimum value within a range of approximately 20 mrad to 300 mrad at 200 kV.

Similarly, there is also the optimum value within a scattering angle to be detected in the EELS. In NPL 2 (section 61), inelastically scattered electrons caused by plasmon excitation or the like spread out from the central beam such that the detection efficiency increases as the scattering angle to be detected increases and an analytical result with good S/N is given is described.

In PTL 1, in a TEM/STEM device to which the EELS is attached, by disposing an electron lens between an annular dark field electron detector and a bright field electron detector and by setting an object point of an EELS spectrometer as a virtual image, the mechanical incidence angle to the EELS spectrometer decreases without changing an acceptance angle to the annular dark field electron detector and an acceptance angle to the bright field electron detector is described.

CITATION LIST

Patent Literature

PTL 1: JP-A-2004-319233

NPL 1: R. F. Egerton: Electron Energy loss Spectroscopy in the Electron Microscopy, Third Edition, Plenum Press NPL 2: Daisuke Shindo, Tetsuo Oikawa: Analytical Electron Microscopy for Material Evaluation, Kyoritsu Publishing Co., Ltd.

SUMMARY OF INVENTION

Technical Problem

The inventor of the present invention earnestly considers to observe a bright field STEM, a dark field image STEM, and the EELS with high resolution at a low acceleration voltage of 40 kV or less for the purpose of avoiding sample damage due to a primary electron beam, contrasting enhancement, and the like. As a result of the observation, the following findings are obtained.

Hereinafter, in a case where an "acceptance angle" is described, it is referred to as a scattering angle converted on a sample surface detected by a detector. In a case where referring to an angle from the electron beam incident on the detector, it is referred to as an "incidence angle".

In a bright field STEM, a dark field image STEM, and EELS, it is preferable that respective appropriate acceptance angles are different from each other and appropriately adjusted according to observation conditions.

In NPL 1 (section 103), as a method for controlling the acceptance angle, a method of using a lens disposed on a downstream side of the sample is described.

However, in a case of using the lens disposed on a downstream side of the sample, although it is possible to focus the electron beam spread out from the central beam and control the acceptance angle, this lens is disposed in a position spaced from the sample due to space problems of the device. In this case, chromatic aberration inevitably increases in accordance with the control of the acceptance angle, which leads to deterioration of the energy resolution of the EELS. Specifically, at low acceleration voltage, the chromatic aberration is more likely to be affected than high acceleration voltage.

In addition, as described in NPL 2, as the scattering angle to be detected increases, the detection efficiency of EELS increases. However, in a case where a detection angle randomly increases, the energy resolution of the EELS may deteriorate due to the aberration of the energy spectroscopy. For this reason, it is preferable that the scattering angle is appropriately adjusted according to observation conditions. Furthermore, even in a case where the scattering angle which can be incorporated with the detector is the same, as the acceleration voltage decreases, the detection efficiency deteriorates.

In addition, in PTL 1, due to a space requirement, the electron lens is located at a position separated from the sample such that focal length becomes longer and inevitably color aberration becomes a problem. Since PTL 1 is a TEM/STEM and based on the high acceleration voltage, the problem of the chromatic aberration is not focused.

An object of the present invention is to perform high-resolution observation on the bright field STEM, the dark field image STEM, and the EELS at a low acceleration voltage.

Solution to Problem

The present invention relates to controlling on an acceptance angle of a STEM detector and an electron energy loss spectroscopy by changing the disposition of a sample with respect to an optical axis direction of a primary electron beam in a scanning transmission microscopy including an electron energy loss spectroscopy.

Advantageous Effects of Invention

According to the present invention, it is possible to easily control a scattering angle in a bright field STEM, a dark field STEM, and an EELS while suppressing occurrence of chromatic aberration accompanying the controlling on the acceptance angle.

BRIEF DESCRIPTION OF DRAWINGS

FIG. 1 is a schematic configuration diagram of a STEM including an EELS according to Example 1.

FIG. 2 is a schematic diagram for explaining a focusing operation of an objective rear magnetic field lens.

FIG. 3 is a graph indicating a relationship between a position of a sample and magnification of the objective rear magnetic field lens.

FIG. 4 is a schematic side view of a stage driving mechanism according to Example 1.

FIG. 5 is a main part sectional view of a tip end portion of a sample holder according to Example 2.

FIG. 6 is a sectional view of a sample table having various heights according to Example 2.

DESCRIPTION OF EMBODIMENTS

In an example, in a scanning transmission microscopy including an electron source that emits a primary electron beam, a stage drive mechanism that moves a sample table holding a sample, an objective magnetic field lens that focuses a primary electron beam on a sample, a scanning coil that two-dimensionally scans the primary electron beam irradiated on the sample, a STEM detector that detects the electron that is transmitted the sample, and an electron energy loss spectroscopy that detects energy loss spectrum of electrons transmitted the sample, controlling acceptance angles on the STEM detector and the electron energy loss spectroscopy by changing disposition of the sample with respect to an optical axis direction of the primary electron beam is disclosed.

In addition, in the example, the scanning transmission microscopy in which acceleration voltages of bright field STEM observation, dark field STEM observation, and EELS observation are 40 kV or less is disclosed.

In addition, in the example, the scanning transmission microscopy that changes the disposition of the sample with respect to the optical axis direction of the primary electron beam according to switching between the bright field STEM observation, the dark field STEM observation, and the EELS observation is disclosed. In addition, the scanning transmission microscopy that automatically changes controlling on the magnetic field lens and the scanning coil according to the switching is disclosed.

In addition, in the example, the scanning transmission microscopy that adjusts the disposition of the sample with respect to the optical axis direction of the primary electron beam by driving the stage drive mechanism is disclosed.

In addition, in the example, the scanning transmission microscopy that adjusts the disposition of the sample with respect to the optical axis direction of the primary electron beam by replacing the sample tables having different heights is disclosed.

In addition, in the example, a method which is an observation method of the STEM and the EELS in the scanning transmission microscopy including the electron energy loss spectroscopy, and controls acceptance angles of the STEM detector and the electron energy loss spectroscopy by changing the disposition of the sample with respect to the optical axis direction of the primary electron beam emitted from the electron source is disclosed.

In addition, in the example, observation methods of the STEM and the EELS in which acceleration voltages of the bright field STEM observation, the dark field STEM observation, and the EELS observation are 40 kV or less are disclosed.

In addition, in the example, the observation methods of the STEM and the EELS that change the disposition of the sample with respect to the optical axis direction of the primary electron beam is changed according to the switching between the bright field STEM observation, the dark field STEM observation, and the EELS observation are disclosed. In addition, according to the switching, the observation methods of the STEM and the EELS in which the controlling on the magnetic field lens that focuses the primary electron beam on the sample and the scanning coil that two-dimensionally scans the primary electron beam irradiated on the sample is automatically changed are disclosed.

In addition, in the example, the observation methods of the STEM and the EELS that adjust the disposition of the sample with respect to the optical axis direction of the primary electron beam by controlling of the stage drive mechanism that moves the sample table holding the sample are disclosed.

In addition, in the example, the observation methods of the STEM and the EELS that adjust the disposition of the sample with respect to the optical axis direction of the primary electron beam by replacing the sample tables having different heights are disclosed.

Hereinafter, the above and other novel features and effects will be described with reference to the drawings.

Example 1

FIG. 1 is a schematic configuration diagram of the STEM including the EELS according to Example 1. A primary electron beam 19 emitted from an electron source 1 focuses on the sample by a focusing lens 3 and an objective anterior magnetic field lens 7. In addition, the primary electron beam 19 supplies a scanning signal from an electronic optical control signal generator 22 to an electron beam scanning coil 5 and is scanned on a surface of the sample. A sample 30 is disposed in the magnetic field of an objective lens. It is assumed that among the objective lens, a member of the upper side of the sample 30 is the objective anterior magnetic field lens 7 and a member of the lower side thereof is an objective rear magnetic field lens 9. When the primary electron beam 19 is irradiated on the sample 30, a secondary electron 6 is generated, and detected by a secondary electron detector 20 disposed on an upper portion of the objective anterior magnetic field lens 7. In addition, in a case where the sample 30 is a thin film or minute particles and an acceleration voltage of the primary electron beam19 is sufficiently high and scattered electrons 10 transmits the sample 30. Then, the scattered electrons 10 are detected by a dark field STEM detector 11 disposed in a lower portion of the objective rear magnetic field lens 9, abright field STEM detector 13, or an EELS spectrum detector 18.

The electron beam passing through an opening provided in the dark field STEM detector 11 is incident on the bright field STEM detector 13. Since the acceptance angle is usually larger thannec essary, the acceptance angle is limited by using a bright field STEM diaphragm 12.

When the bright field STEM diaphragm 12 and a bright field ST EM detector 13 retreat outside an optical axis, the electron beam passing through an opening provided in the dark field STEM detector 11 is incident on an energy spectroscopy 17. Since the acceptance angle is also unnecessarily large, the acceptance angle is limited by an EELS incident diaphragm 14. A multipole lens 15 has a function of focusing the electron beam on a spectrum detector 18, and a quadrupole lens 16 has a function of expanding or reducing chromatic dispersion generated by an energy spectroscopy 17. By separating the electron beam for each loss energy, it is possible to acquire an energy spectrum.

FIG. 2 is a schematic diagram for explaining a focusing operation of the objective rear magnetic field lens. FIG. 3 is a graph indicating a relationship between a position of the sample and magnification of the objective rear magnetic field lens. By using FIG. 2 and FIG. 3, controlling of the acceptance angle will be described. The acceptance angle in each detector is adjusted by the angular magnification of the objective rear magnetic field lens 9. Here, the angular magnification Ma is defined as $|Ma|=\beta/\gamma$. In the present example, as shown in FIG. 2, it is assumed that $\beta$ is the acceptance angle and $\gamma$ is an incidence angle. As shown in FIG. 3, the angular magnification is changed by the disposition of the sample 30 in a direction of an optical axis 34. The infinite angular magnification means a state where a virtual object point 32 is regarded as infinity, that is, a state where the scattered electrons 10 are in parallel with the optical axis 34. Depending on a structure of the objective lens, the scattered electrons may be focused a plurality of times, and in such a case, the angular magnification becomes infinite extending to a plurality of positions of the sample.

FIG. 4 is a schematic side view of a stage drive mechanism according to the present example. In the present example, a stage drive mechanism 21 is used as specific means for changing the disposition of the sample 30 with respect to the optical axis 34. A tip end of the sample holder8 inserted into the objective lens comes into contact with the fine movement tube 26. The fine movement tube 26 is supported by the fine movement tube receiver 27. Vertical movement in the optical axis direction of a Z fine movement stage 28 is transmitted to a support rod of the sample holder 8 and converted into rotational motion. As a result, a position of the optical axis direction of the sample 30 is changed and the acceptance angles of the bright field STEM, the dark field STEM, and the EELS are changed. Since an appropriate acceptance angle varies depending on each of observation conditions, the disposition of the sample is appropriately adjusted by stage driving. In this case, an operating range of the sample is approximately ±0.3 mm.

In the device, a plurality of observation modes is registered in advance for each purpose. A user selects a mode on a screen of a monitor 23 as necessary. Then, a control signal is sent from a stage control signal generator 35 to the Z fine movement stage 28, and it is automatically set to the position of the sample 30 suitable for the selected observation mode. At this time, at a timing when the observation mode is switched, a control signal is sent from the electronic optical control signal generator 22 to the electron beam scanning coil 5, the focusing lens 3, and the objective lens, and automatically set to the optimum control value. For example, the observation mode is registered with names such as an EELS high S/N mode and a dark field STEM-heavy element observation mode.

One of the advantages of adjusting the angular magnification by the disposition of the sample 30 with respect to the optical axis 34 is that an optical system with small chromatic aberration can be realized. Since the sample 30 is disposed in the magnetic field of the objective lens, a focal length is extremely small such that it is possible to suppress the chromatic aberration acting on the scattered electron 10. In a case where observing at a low acceleration voltage so that the sample 30 is not damaged by the irradiation of the primary electron beam 19 or the contrast is emphasized, since the chromatic aberration is more likely to be affected as compared with a high acceleration voltage, compatibility with the above configuration is very good.

Example 2

In the present example, a basic operation of the electron microscopy is the same as that in Example 1, but the present example is different from Example 1 in that replacing of the sample table as means for changing the disposition of the sample is used. Hereinafter, differences from Example 1 will be mainly described.

FIG. 5 is a main part sectional view of a tip end of a sample holder according to the present example, and FIG. 6 is a sectional view of the sample table having various heights according to the present example. A sample table 29 is fixed to a tip end portion of the sample holder 8, and formed as a structure having an opening through which the scattered electrons 10 are transmitted. The sample is attached to an upper portion of the opening. This sample table is fixed to the tip end portion of the sample holder 8 so as to be removable by a screw, a pressing spring, an adhesive paste, or the like. As shown in FIG. 6, the sample tables 29*a*, 29*b*, 29*c*, or the like of various heights are prepared, it is possible to change the disposition of the optical axis direction of the sample by replacing the sample table 29. In this case, since there is no particular restriction on the sample table, it is possible to largely change the disposition of the sample as compared to Example 1.

Example 3

In the present example, a combination of Example 1 and Example 2 is used. That is, in order to change the disposition of the optical axis direction of the sample 30, by using driving of the Z fine movement stage 28 and replacement of the sample table 29 together, more flexible correspondence becomes possible.

The present invention can also be adopted for TEM/STEM which can set the acceleration voltage of 100 kV or more, but is particularly suitable for a scanning electron microscopy having a maximum acceleration voltage of 40 kV or less.

REFERENCE SIGNS LIST

1 electron source
3 focusing lens
4 objective diaphragm
5 electron beam scanning coil
6 secondary electron
7 objective anterior magnetic field lens
8 sample holder
9 objective rear magnetic field lens
10 scattered electron
11 dark field STEM detector
12 bright field STEM diaphragm

13 bright field STEM detector
14 EELS incident diaphragm
15 multipole lens
16 quadrupole lens
17 energy spectroscopy
18 EELS spectrum detector
19 primary electron beam
20 secondary electron detector
21 stage drive mechanism
22 electronic optical control signal generator
23 monitor
24 objective lens upper magnetic pole
25 objective lens lower magnetic pole
26 fine movement tube
27 fine movement tube receiver
28 Z fine movement stage
29 sample table
29*a* sample table (high)
29*b* sample table (medium)
29*c* sample table (low)
30 sample
31 electron beam
32 virtual object point
33 diaphragm
34 optical axis
35 stage control signal generator

The invention claimed is:

1. A scanning transmission microscope comprising:

an electron source that emits a primary electron beam;

a stage drive mechanism that moves a sample table holding a sample;

an objective magnetic field lens that focuses the primary electron beam on the sample;

a scanning coil that two-dimensionally scans the primary electron beam irradiated on the sample;

a STEM detector that detects electrons transmitted through the sample; and an electron energy loss spectrum (EELS) detector that detects an energy loss spectrum of electrons transmitted through the sample, wherein acceptance angles of the STEM detector and the EELS detector by changing disposition of the sample with respect to an optical axis direction of the primary electron beam are controlled, and wherein the disposition of the sample is changed with respect to the optical axis direction of the primary electron beam according to switching the STEM detector between bright field STEM observation, dark field STEM observation, and EELS observation.

2. The scanning transmission microscope according to claim 1, wherein acceleration voltages detected by each STEM detector for bright field STEM observation and dark field STEM observation, and detected by the EELS detector for EELS observation are 40 kV or less.

3. The scanning transmission microscope according to claim 1, wherein controlling of the magnetic field lens and the scanning coil according to the switching is automatically changed.

4. The scanning transmission microscope according to claim 1, wherein the disposition of the sample is adjusted with respect to the optical axis direction of the primary electron beam by driving of the stage drive mechanism.

5. The scanning transmission microscope according to claim 1, wherein the disposition of the sample is adjusted with respect to the optical axis direction of the primary electron beam by replacing a first sample table with a second sample table having a different height.

6. An observation method in a scanning transmission microscope including an electron energy loss spectrum (EELS) detector, the method comprising:

controlling acceptance angles of a STEM detector and the electron energy loss spectrum detector by changing a disposition of a sample with respect to an optical axis direction of a primary electron beam emitted from an electron source; and changing the disposition of the sample with respect to the optical axis direction of the primary electron beam according to switching the STEM detector between bright field STEM observation, dark field STEM observation, and EELS observation.

7. The observation method according to claim 6, wherein an acceleration voltage used by each STEM detector for bright field STEM observation and dark field STEM observation, and used by the EELS detector for EELS observation is 40 kV or less.

8. The observation method according to claim 6, further comprising:

automatically changing controlling on a magnetic field lens that focuses the primary electron beam on the sample and a scanning coil that two-dimensionally scans the primary electron beam irradiated on the sample according to the switching.

9. The observation method according to claim 6, further comprising:

adjusting the disposition of the sample with respect to the optical axis direction of the primary electron beam by controlling of a stage drive mechanism that moves a sample table holding the sample.

10. The observation method according to claim 6, further comprising:

adjusting the disposition of the sample with respect to the optical axis direction of the primary electron beam by replacing a first sample table with a second sample table having a different height.

* * * * *